United States Patent [19]
Lee

[11] Patent Number: 6,034,916
[45] Date of Patent: Mar. 7, 2000

[54] DATA MASKING CIRCUITS AND METHODS FOR INTEGRATED CIRCUIT MEMORY DEVICES, INCLUDING DATA STROBE SIGNAL SYNCHRONIZATION

[75] Inventor: Jae-hyeong Lee, Kyungki-do, Rep. of Korea

[73] Assignee: Samsung Electronics Co., Ltd., Rep. of Korea

[21] Appl. No.: 09/172,415

[22] Filed: Oct. 14, 1998

[30] Foreign Application Priority Data

Nov. 18, 1997 [KR] Rep. of Korea ........................ 97-60814

[51] Int. Cl.[7] ......................................... G11C 8/00
[52] U.S. Cl. ........................................... 365/233; 365/193
[58] Field of Search ................................. 365/233, 193, 365/201

[56] References Cited

U.S. PATENT DOCUMENTS

| | | | |
|---|---|---|---|
| 5,315,560 | 5/1994 | Nishimoto et al. | 365/238.5 |
| 5,384,750 | 1/1995 | Lee | 365/233 |
| 5,539,696 | 7/1996 | Patel | 365/189 |
| 5,555,526 | 9/1996 | Kim | 365/203 |
| 5,568,445 | 10/1996 | Park et al. | 365/233 |
| 5,787,046 | 7/1998 | Furuyama et al. | 365/230.01 |
| 5,835,446 | 11/1998 | Park | 365/233 |
| 5,930,194 | 7/1999 | Yamagata et al. | 365/230.01 |
| 5,946,256 | 8/1999 | Okimura | 365/230.01 |

*Primary Examiner*—David Nelms
*Assistant Examiner*—Vanthu Nguyen
*Attorney, Agent, or Firm*—Myers Bigel Sibley & Sajovec

[57] ABSTRACT

External data and an external data masking signal are synchronized to a data strobe signal rather than a clock signal in an SDRAM. Since both the data masking signal and the data are synchronized with the data strobe signal, they can react in the same way to conditions such as voltage, temperature and process variations. Accordingly, the sampling window of the data can be larger and the number of pins for inputting the data masking signal need not increase. More specifically, integrated circuit memory devices include a memory cell array and an address buffer that buffers address data for the memory cell array in response to a clock signal. A command buffer buffers read and write commands for the memory cell array in response to the clock signal. The data input and output buffer buffers data for the memory cell array in response to a data strobe signal that is different from the clock signal. A data masking buffer buffers the data masking signal that masks the data in response to the data strobe signal. A circuit is responsive to the address buffer, the command buffer, the data input and output buffer and the data masking buffer, to produce first and second masked data on first and second data lines of the memory cell array.

34 Claims, 5 Drawing Sheets

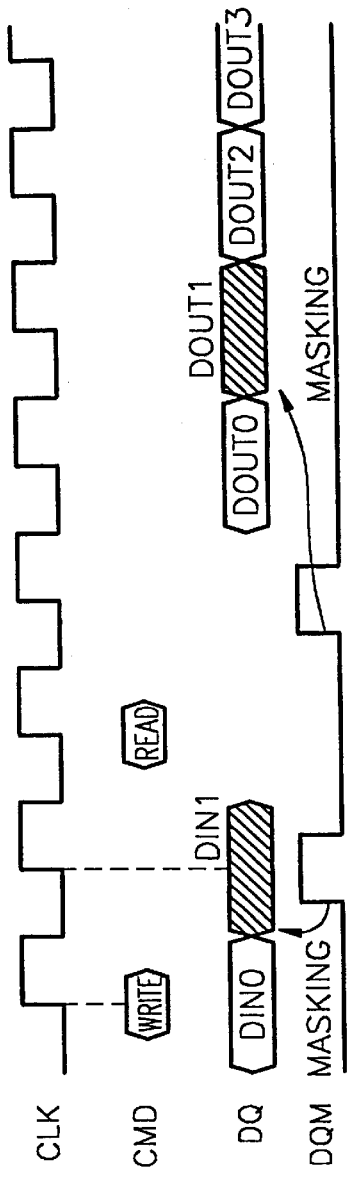
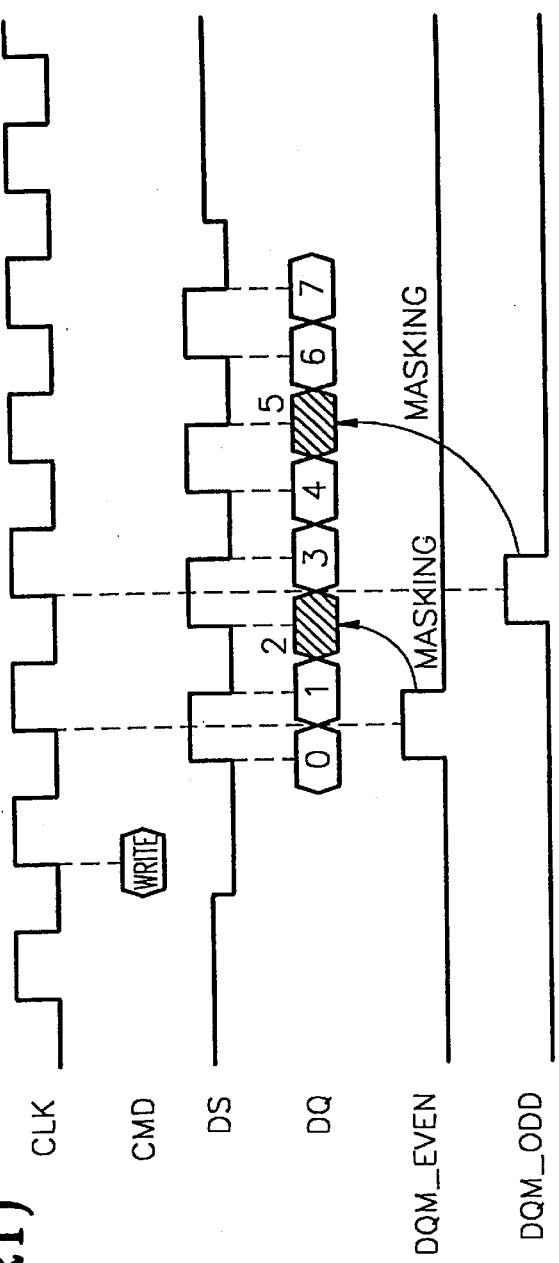
FIG. 1 (PRIOR ART)
FIG. 2 (PRIOR ART)

DATA MASKING CIRCUITS AND METHODS FOR INTEGRATED CIRCUIT MEMORY DEVICES, INCLUDING DATA STROBE SIGNAL SYNCHRONIZATION

FIELD OF THE INVENTION

The present invention relates to integrated circuit memory devices, and more particularly to data masking circuits and data masking methods for integrated circuit memory devices.

BACKGROUND OF THE INVENTION

Integrated circuit memory devices are widely used in consumer and commercial applications. More specifically, conventional read/write memory devices such as Dynamic Random Access Memory (DRAM) devices are often used as part of a data processing system that includes a Central Processing Unit (CPU). It may be difficult to operate a conventional DRAM at speeds that are compatible with the overall system speed.

In order to allow a DRAM to operate at high speed, "synchronous" DRAMs, also referred to as SDRAMs, have been developed. A synchronous DRAM can receive a system clock that is synchronous with the processing speed of the overall system. The internal circuitry of the SDRAM can be operated in such a manner as to accomplish read/write operations in synchronism with the system clock. Thus, for example, in an SDRAM, a row active signal and a read/write command may be input in synchronization with the system clock. SDRAMs are described in U.S. Pat. No. 5,610,874 to Park et al. entitled "Fast Burst-Mode Synchronous Random Access Memory Device"; U.S. Pat. No. 5,384,750 to Lee entitled "Data Output Buffer of a Synchronous Semiconductor Memory Device"; U.S. Pat. No. 5,555,526 to Kim entitled "Synchronous Semiconductor Memory Device Having an Auto-Precharge Function"; and U.S. Pat. No. 5,568,445 to Park et al. entitled "Synchronous Semiconductor Memory Device With a Write Latency Control Function", assigned to the assignee of the present application, the disclosures of which are hereby incorporated herein by reference.

It is also known to use a data input/output mask (DQM) signal that is applied from external to the integrated circuit, in order to mask output data from the memory device during a read operation and to mask input data to the memory device during a write operation. More specifically, if the DQM signal is applied when the output data is generated by an output driver during a read operation, the read DQM latency may be equal to 2. Accordingly, the second generated output data from the time the DQM signal is applied, is masked. On the other hand, the write DQM latency may be equal to 0 during the write operation, to prevent the enabling of a column select line corresponding to an address to which the DQM signal is applied. Accordingly, the writing of data to the corresponding memory cell is masked. An SDRAM generally includes a data input/output masking pin (DQM pin) for masking undesired data when a data read/write command is generated, as described above.

SDRAMs include Single Data Rate (SDR) SDRAMs and Double Data Rate (DDR) SDRAMs. In an SDR SDRAM, data can be input and output at either only the rising edge or only the falling edge of a clock signal. In a DDR SDRAM, data can be input and output at both the rising and falling edges of the clock signal. Therefore, the DDR SDRAM can have a data bandwidth which is twice the clock frequency.

FIG. 1 is a timing diagram showing a data masking method of an SDR SDRAM according to conventional technology. Referring to FIG. 1, the data DQ, the command CMD, and the data masking signal DQM are synchronized to the rising edge of a clock CLK. The masking latency for reading the data DQ is 2. The masking latency for writing the data DQ is 0.

Therefore, when the command CMD for writing the data DQ is applied, the data DQ is masked when the data masking signal DQM is activated to logic high, i.e., first input data (DIN1). When the command CMD for reading the data DQ is applied, the data DQ is masked after two periods of the clock CLK, i.e., first output data DOUT1 after the data masking signal DQM is activated to logic high. In FIG. 1, the first input data DIN1 and the first output data DOUT1 are marked with diagonal shading in the data DQ.

In an integrated circuit memory device, the input and output of the data are performed under the control of a set of integrated circuit devices, referred to as a "chipset". In the data read command, data can be masked in the chipset without masking the data in the DRAM since the data is transmitted from the DRAM to the CPU. However, in the data write command, the data which is not desired to be written is generally masked in the DRAM since the data is transmitted from the CPU to DRAM. Therefore, in the data write command, the data is generally masked in the DRAM. In the data read command, the data need not necessarily be masked in the DRAM.

In a DDR SDRAM, the data is sampled at the rising and the falling edges of the clock and all the commands excluding the data are sampled at the rising edge of the clock. Thus, when the data masking signal is activated to logic high during the "1" period of the clock, two successive data are masked. The sampling window of the data is therefore reduced to half that of the SDR synchronous DRAM. Therefore, the data may need to be fetched quickly.

In order to solve the above problem, a data strobe signal for fetching the input and output data is used. The data may be input and output by synchronizing the data with the data strobe signal.

FIG. 2 is a timing diagram showing a method for masking the data of a DDR SDRAM according to conventional technology. Referring to FIG. 2, the data masking signal DQM is synchronized at the rising edge of the clock CLK. The data DQ is not synchronized with the clock CLK and is synchronized at the rising and falling edges of the data strobe signal DS for fetching the data DQ. Therefore, two successive data units of the data DQ are written during one period of the data strobe signal DS.

The data masking signal DQM is synchronized at the rising edge of the clock CLK and is divided into a first data masking signal DQM_EVEN for masking even data DQ and a second data masking signal DQM_ODD for masking odd data DQ.

The data masked by the first data masking signal DQM_EVEN and the second data masking signal DQM_ODD are marked with diagonal shading in FIG. 2.

However, since the data masking signals double in the above method, the number of pins to which the data masking signals are input may also double. Accordingly, the number of pins of the chipset may increase. For example, a current PC chipset includes eight data masking pins to which the data masking signal is input. When the data masking pins are increased to sixteen in an SDRAM package, the data masking pins of the chipset may also need to be increased to sixteen.

SUMMARY OF THE INVENTION

It is therefore an object of the present invention to provide improved synchronous memory devices and methods.

It is another object of the present invention to provide improved data masking circuits and methods for integrated circuit memory devices.

It is another object of the present invention to provide data masking circuits and methods that can mask data without the need to increase the number of data masking pins.

These and other objects are provided, according to the present invention, by synchronizing the external data and the external data masking signal to a data strobe signal rather than a clock signal. Since both the data masking signal and the data are synchronized with the data strobe signal, they can react in the same way to conditions such as voltage, temperature and process variations. Accordingly, the sampling window of the data can be larger and the number of pins for inputting the data masking signal need not increase.

More specifically, integrated circuit memory devices according to the invention include a memory cell array and an address buffer that buffers address data for the memory cell array in response to a clock signal. A command buffer buffers read and write commands for the memory cell array in response to the clock signal. The data input and output buffer buffers data for the memory cell array in response to a data strobe signal that is different from the clock signal. A data masking buffer buffers the data masking signal that masks the data in response to the data strobe signal. A circuit is responsive to the address buffer, the command buffer, the data input and output buffer and the data masking buffer, to produce first and second masked data on first and second data lines of the memory cell array.

In one embodiment, the circuit comprises a column select line signal generating portion that is responsive to the address buffer, the command buffer and the data masking buffer to generate first and second column select line signals. A data transmitting portion is responsive to the data input and output buffer to generate first and second data. A column selecting portion transmits the first and second data to the first and second data lines in response to the respective first and second column select line signals, to produce the first and second masked data on the first and second data lines.

In another embodiment, the circuit comprises a column select line signal generating portion that is responsive to the address buffer and the command buffer, to generate the first and second column select line signals. The data transmitting portion is responsive to the data input and output buffer and the data masking buffer, to generate first and second data. A column selecting portion transmits the first and second data to the first and second data lines in response to the respective first and second column select line signals, to produce the first and second masked data on the first and second data lines.

The column selecting portion preferably includes a first transistor that is gated by the first column select line signal, to produce the first masked data on the first data line. A second transistor is gated by the second column select line signal, to produce the second masked data on the second data line.

Data masking methods for integrated circuit memory devices according to the present invention, synchronize an address and a write command with a clock signal and synchronize data and a data masking signal with a data strobe signal that is different from the clock signal. First and second column select line signals are generated in response to the address and to the write command so synchronized. First and second data that is synchronized with rising and falling edges of the data strobe signal, respectively, is generated in response to the data so synchronized. The first and second data is transferred to the first and second data lines in response to the respective first and second column select line signals, to produce first and second masked data on the first and second data lines.

In one embodiment, the step of generating first and second column select line signals is performed by generating first and second column select line signals that are masked in response to the address and the write command that are synchronized with the clock signal and the data masking signal that is synchronized with the data strobe signal. In another embodiment, the step of generating first and second data is performed by generating first and second data that is masked by the data masking signal and is synchronized with rising and falling edges of the data strobe signal, respectively, in response to the data so synchronized. Accordingly, since both the data masking signal and the data are synchronized with the data strobe signal, they may react in the same ways to conditions such as voltage, temperature and process variations. The sampling window of the data can become larger and the number of pins for inputting the data masking signal need not increase.

BRIEF DESCRIPTION OF THE DRAWINGS

FIG. 1 is a timing diagram showing a data masking method of an SDR SDRAM according to conventional technology;

FIG. 2 is a timing diagram showing a data masking method of a DDR SDRAM according to conventional technology;

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
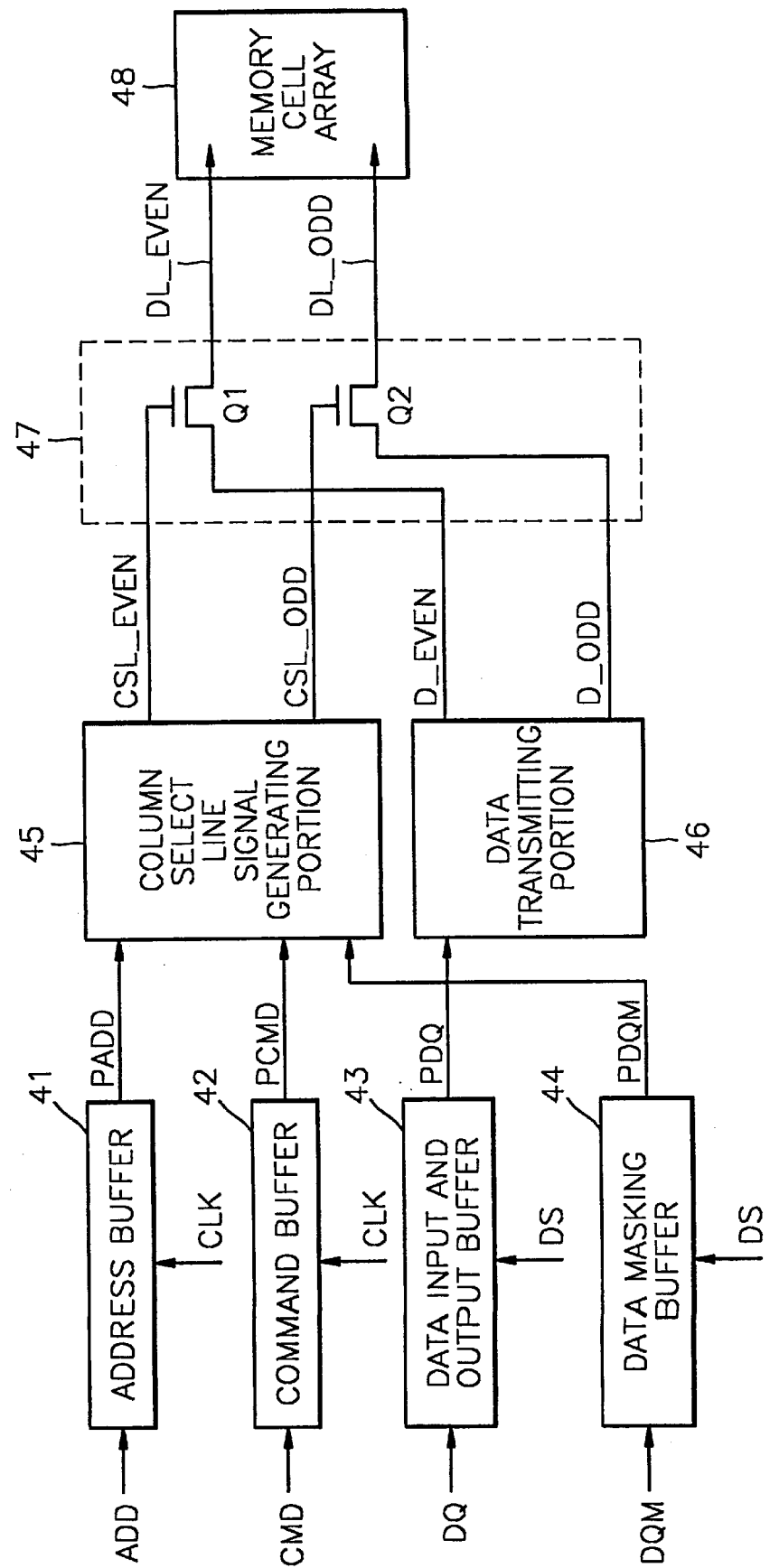
FIG. 3 is a block diagram of data masking circuits and methods for integrated circuit memory devices according to the present invention.

Referring now to FIG. 3, a first embodiment of an integrated circuit memory device including data masking circuits and methods according to the present invention includes an address buffer 41, a command buffer 42, a data input and output buffer 43, a data masking buffer 44, a column select line signal generating portion 45, a data transmitting portion 46, a column selecting portion 47 and a memory cell array 48.

The address buffer 41 receives an external address ADD and a clock CLK from external to the memory device, and outputs an internal address PADD which is synchronized with the clock CLK and buffered. The command buffer 42 receives the clock CLK and a command CMD for reading or writing the data, and outputs an internal command PCMD which is synchronized with the clock CLK and buffered.

The data input and output buffer 43 receives external data DQ and a data strobe signal DS and outputs an internal data PDQ which is synchronized with the data strobe signal DS and buffered. The data strobe signal DS is a signal input from external to the memory device in order to fetch the external data DQ.

The data masking buffer 44 receives the data strobe signal DS and a data masking signal DQM, to mask the external data DQ, and outputs an internal data masking signal PDQM which is synchronized with the data strobe signal DS and buffered. The data transmitting portion 46 outputs a first data D_EVEN which is synchronized at the rising edge of the data strobe signal DS and a second data D_ODD which is synchronized at the falling edge of the data strobe signal DS, in response to the internal data PDQ which is synchronized at the rising edge and the falling edge of the data strobe signal DS.

The column select line signal generating portion 45 combines the internal address PADD with the internal data masking signal PDQM, in response to the internal address PADD, the internal command PCMD, and the internal data masking signal PDQM, and generates a first column select line signal CSL_EVEN that outputs the first data D_EVEN and a second column select line signal CSL_ODD, that outputs the second data D_ODD. The first and second column select line signals CSL_EVEN and CSL_ODD are synchronized at the rising edge or falling edge of the data strobe signal DS without being activated when the internal data masking signal PDQM is activated.

The column selecting portion 47 includes a first NMOS transistor Q1 and a second NMOS transistor Q2. The first NMOS transistor Q1 is turned on (gated) when the first column select line signal CSL_EVEN rises to logic high and transfers the first data D_EVEN to the first data line DL_EVEN. The second NMOS transistor Q2 is turned on when the second column select line signal CSL_ODD rises to logic high and transfers the second data D_ODD to the second data line DL_ODD. However, when the first column select line signal CSL_EVEN is not activated, the first data D_EVEN is masked. When the second column select line signal CSL_ODD is not activated, the second data D_ODD is masked. The first column select line signal CSL_EVEN and the second column select line signal CSL_ODD are preferably generated one period of the clock CLK after the external command CMD for writing the external data DQ.

In other words, in the present invention, the external data DQ and the external data masking signal DQM are synchronized with the data strobe signal DS, rather than with the clock CLK. The first column select line signal CSL_EVEN and the second column select line signal CSL_ODD are generated by combining the internal address PADD and the internal data masking signal PDQM. The first data D_EVEN and the second data D_ODD, in which some of the external data DQ are masked by the first column select line signal CSL_EVEN and the second column select line signal CSL_ODD, are respectively transferred to the first data line DL_EVEN and the second data line DL_ODD. Therefore, since the data masking signal DQM and the external data DQ are all synchronized with the data strobe signal DS, they can react in the same way to voltage, temperature, and process variations. Accordingly, the sampling window of the data can become larger and the number of pins for inputting the data masking signal DQM need not increase.

Figure 4:
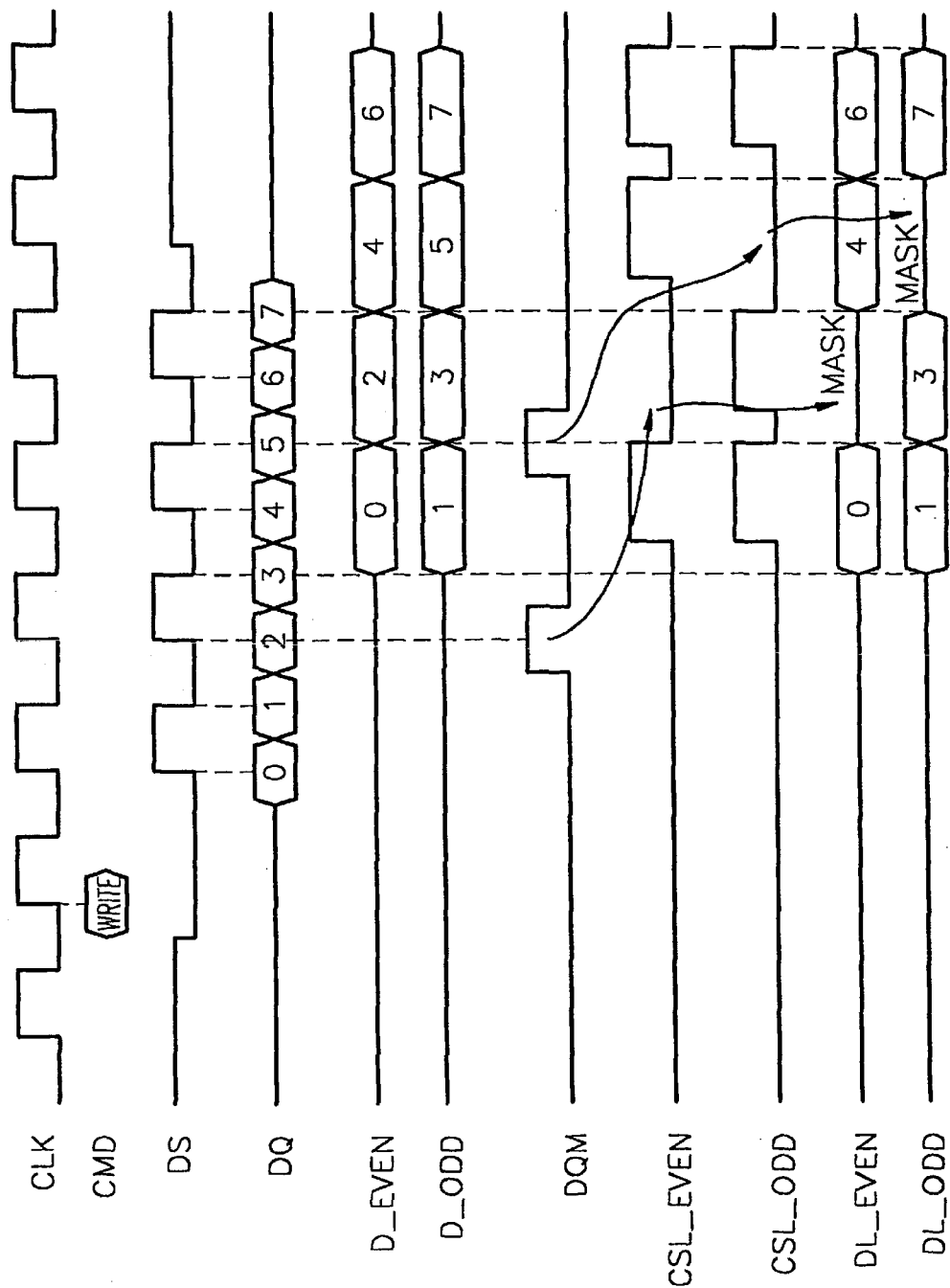
FIG. 4 is a timing diagram of signals shown in FIG. 3.

FIG. 4 is a timing diagram of the signals shown in FIG. 3. Referring to FIG. 4, the external data DQ is synchronized at the rising and falling edges of the data strobe signal DS and the external data masking signal DQM masks the data units 2 and 5 from the external data DQ. The data strobe signal DS is input after the command CMD for writing the external data DQ is input.

The first data line D_EVEN includes data 0, 2, 4, and 6 synchronized at the rising edge of the data strobe signal DS. The second data line D_ODD includes data 1, 3, 5, and 7 synchronized at the falling edge of the data strobe signal DS. The first and second column select line signals CSL_EVEN and CSL_ODD are synchronized at the rising edge of the data strobe signal DS and are not activated when the data masking signal DQM is activated to logic high.

When the first column select line signal CSL_EVEN is activated, the first data D_EVEN is output to the first data line DL_EVEN and only the data 2 from the first data D_EVEN is masked in the first data line DL_EVEN. When the second column select line signal CSL_ODD is activated, the second data D_ODD is output to the second data line DL_ODD. Therefore, only the data 2 from the first data D_EVEN is masked in the first data line DL_EVEN and only the data 5 from the D_ODD is masked in the second data line DL_ODD.

Figure 5:
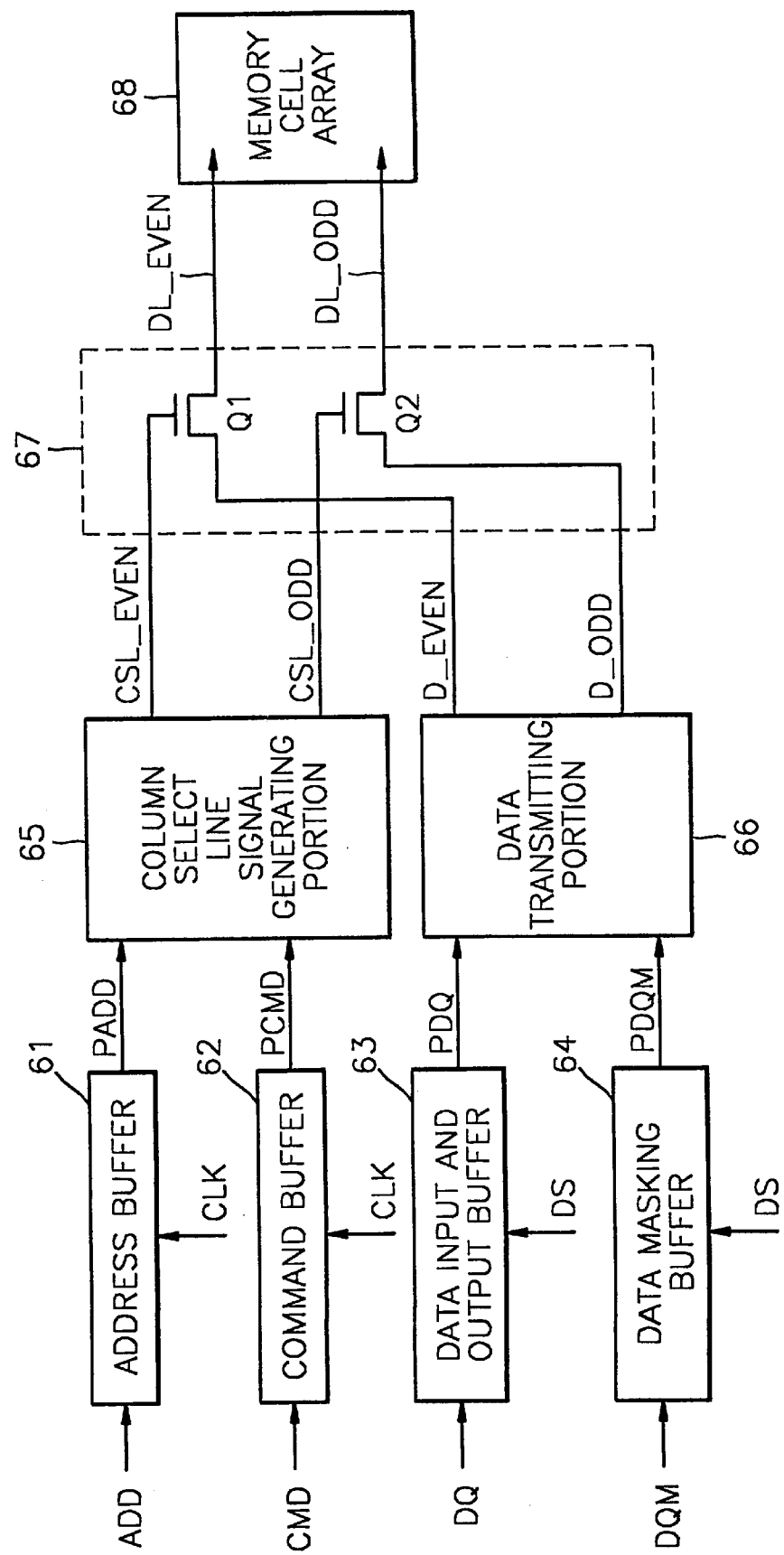
FIG. 5 is a block diagram of second data masking circuits and methods for integrated circuit memory devices according to the present invention.

Referring now to FIG. 5, a second embodiment of integrated circuit memory devices including data masking circuits and methods according to the present invention includes an address buffer 61, a command buffer 62, a data input and output buffer 63, a data masking buffer 64, a column select line signal generating portion 65, a data transmitting portion 66, and a column selecting portion 67 and a memory cell array 68. The address buffer 61, the command buffer 62, the data input and output buffer 63, the data masking buffer 64 and the memory cell array 68 are the same elements as the address buffer 41, the command buffer 42, the data input and output buffer 43, the data masking buffer 44, and the memory cell array 48, and need not be described again.

The data transmitting portion 66 outputs the first data D_EVEN which is synchronized at the rising edge of the data strobe signal DS in the internal data PDQ, and the second data D_ODD which is synchronized at the falling edge of the data strobe signal DS in the internal data PDQ, in response to the internal data masking signal PDQM and the internal data PDQ which is synchronized at the rising edge and the falling edge of the data strobe signal DS. However, when the internal data masking signal PDQM is logic high, the first data D_EVEN and the second data D_ODD are masked.

The column select line signal generating portion 65 generates the first column select line signal CSL_EVEN to output the first data D_EVEN and the second column select line signal CSL_ODD to output the second data D_ODD, in response to the internal address PADD output from the address buffer 61 and the internal command PCMD output from the command buffer 62. The first and second column select line signals CSL_EVEN and CSL_ODD are activated when the data strobe signal DS rises to logic high and are generated more than one period of the clock CLK after the command CMD for writing the data DQ.

The column selecting portion 67 includes a first NMOS transistor Q1 and a second NMOS transistor Q2. The first NMOS transistor Q1 is turned on when the first column select line signal CSL_EVEN rises to logic high and transfers the first data D_EVEN to the first data line DL_EVEN. The second NMOS transistor Q2 is turned on when the second column select line signal CSL_ODD rises to logic high and transfers the second data D_ODD to the second data line DL_ODD.

Figure 6:
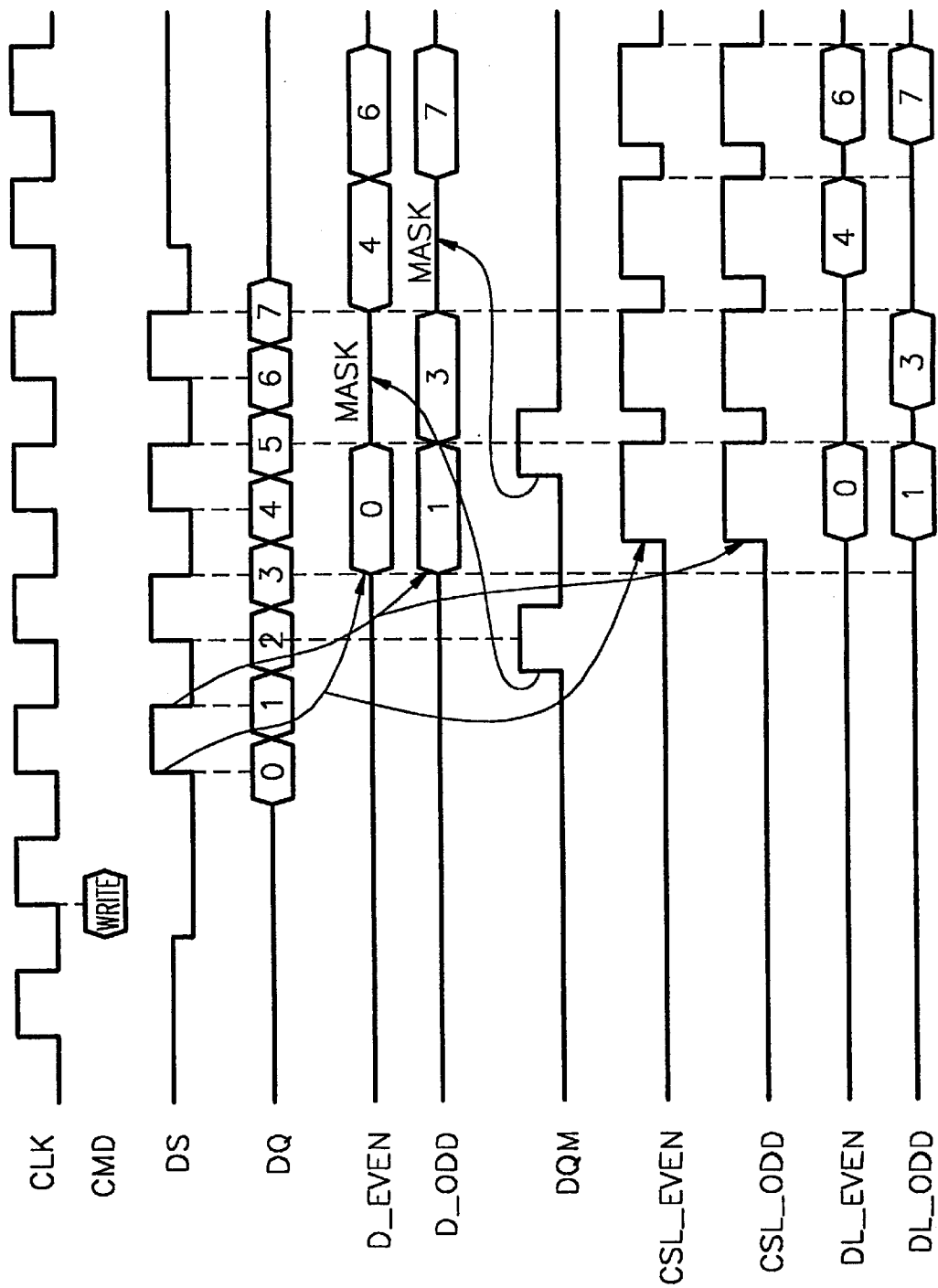
FIG. 6 is a timing diagram of signals shown in FIG. 5.

FIG. 6 is a timing diagram of the signals shown in FIG. 5. Referring to FIG. 6, the external data DQ is alternatively synchronized at the rising and falling edges of the data strobe signal DS and the external data masking signal DQM masks data 2 and 5 from the external data DQ. The data strobe signal DS is input after the command CMD for writing the external data DQ is input.

The first and second data D_EVEN and D_ODD are synchronized at the rising edge of the data strobe signal DS and are generated only when the data masking signal DQM is not activated. Therefore, the data 2 is masked in the first data D_EVEN and the data 5 is masked in the second data D_ODD.

The first and second column select line signals CSL_EVEN and CSL_ODD are activated synchronous with the rising edge of the data strobe signal DS. When the first and second column select line signals CSL_EVEN and CSL_ODD are activated, the first and second data D_EVEN and D_ODD are output to the first and second data lines DL_EVEN and DL_ODD.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
   a memory cell array;
   an address buffer that buffers address data for the memory cell array in response to a clock signal;
   a command buffer that buffers read and write commands for the memory cell array in response to the clock signal;
   a data input and output buffer that buffers data for the memory cell array in response to a data strobe signal that is different from the clock signal; and
   a data masking buffer that buffers a data masking signal that masks the data in response to the data strobe signal.

2. The integrated circuit memory device according to claim 1 further comprising:
   a circuit that is responsive to the address buffer, the command buffer, the data input and output buffer and the data masking buffer, to produce first and second masked data on first and second data lines of the memory cell array.

3. The integrated circuit memory device according to claim 2, wherein the circuit comprises:
   a column select line signal generating portion that is responsive to the address buffer, the command buffer and the data masking buffer to generate first and second column select line signals;
   a data transmitting portion that is responsive to the data input and output buffer to generate first and second data; and
   a column selecting portion that transmits the first and second data to the first and second data lines in response to the respective first and second column select line signals, to produce the first and second masked data on the first and second data lines.

4. The integrated circuit memory device according to claim 2, wherein the circuit comprises:
   a column select line signal generating portion that is responsive to the address buffer and the command buffer to generate first and second column select line signals;
   a data transmitting portion that is responsive to the data input and output buffer and the data masking buffer to generate first and second data; and
   a column selecting portion that transmits the first and second data to the first and second data lines in response to the respective first and second column select line signals, to produce the first and second masked data on the first and second data lines.

5. The integrated circuit memory device according to claim 3, wherein the column selecting portion comprises:
   a first transistor that is gated by the first column select line signal, to produce the first masked data on the first data line; and
   a second transistor that is gated by the second column select line signal, to produce the second masked data on the second data line.

6. The integrated circuit memory device according to claim 4, wherein the column selecting portion comprises:
   a first transistor that is gated by the first column select line signal, to produce the first masked data on the first data line; and
   a second transistor that is gated by the second column select line signal, to produce the second masked data on the second data line.

7. An integrated circuit memory device comprising:
   a memory cell array;
   first means for buffering address data for the memory cell array in response to a clock signal;
   second means for buffering read and write commands for the memory cell array in response to the clock signal;
   third means for buffering data for the memory cell array in response to a data strobe signal that is different from the clock signal; and
   fourth means for buffering a data masking signal that masks the data in response to the data strobe signal.

8. The integrated circuit memory device according to claim 7 further comprising:
   means for producing first and second masked data on first and second data lines of the memory cell array in response to the first, second, third and fourth means for buffering.

9. The integrated circuit memory device according to claim 8, wherein the means for producing comprises:
   fifth means for generating first and second column select line signals in response to the first, second and fourth means for buffering;
   second means for generating first and second data in response to the third means for buffering; and
   means for transmitting the first and second data to the first and second data lines in response to the respective fifth and sixth means for generating, to produce the first and second masked data on the first and second data lines.

10. The integrated circuit memory device according to claim 8, wherein the means for producing comprises:
   first means for generating first and second column select line signals in response to the first and second means for buffering;
   second means for generating first and second data in response to the third and fourth means for buffering; and
   means for transmitting the first and second data to the first and second data lines in response to the respective fifth and sixth means for generating, to produce the first and second masked data on the first and second data lines.

11. A data masking method for an integrated circuit memory device including a memory cell array, the method comprising the steps of:

buffering address data for the memory cell array in response to a clock signal;

buffering read and write commands for the memory cell array in response to the clock signal;

buffering data for the memory cell array in response to a data strobe signal that is different from the clock signal; and buffering a data masking signal that masks the data in response to the data strobe signal.

12. The method according to claim 11 further comprising the step of:

producing first and second masked data on first and second data lines of the memory cell array in response to the address data, the read and write commands, the data and the data masking signal so buffered.

13. The method according to claim 12, wherein the producing step comprises the steps of:

generating first and second column select line signals in response to the address data, the read and write commands and the data masking signal so buffered;

generating first and second data in response to the data so buffered; and transmitting the first and second data to the first and second data lines in response to the respective first and second column select line signals, to produce the first and second masked data on the first and second data lines.

14. The method according to claim 12, wherein the producing step comprises the steps of:

generating first and second column select line signals in response to the address data and the read and write commands so buffered;

generating first and second data in response to the data and the data masking signal so buffered; and transmitting the first and second data to the first and second data lines in response to the respective first and second column select line signals, to produce the first and second masked data on the first and second data lines.

15. A data masking circuit for an integrated circuit memory device, comprising:

a column select line signal generating portion that generates first and second column select line signals from an address and a write command that are synchronized with a clock signal;

a data transmitting portion that transmits first and second data from data that is synchronized with a data strobe signal that is different from the clock signal, at least one of the column select line signal generating portion and the data transmitting portion also being responsive to a data masking signal that is synchronized with the data strobe signal; and a column selecting portion that transmits the first and second data to respective first and second data lines in response to the respective first and second column select line signals.

16. The data masking circuit according to claim 15, wherein the column select line signal generating portion generates the first and second column select line signals from the address and the write command that are synchronized with a clock signal and from the data masking signal that is synchronized with the data strobe signal.

17. The data masking circuit according to claim 15, wherein the data transmitting portion transmits the first and second data from the data and the data masking signal that are synchronized with a data strobe signal.

18. The data masking circuit according to claim 15 further comprising an address buffer that synchronizes the address with the clock signal.

19. The data masking circuit according to claim 15 further comprising a command buffer that synchronizes the write command with the clock signal.

20. The data masking circuit according to claim 15 further comprising a data input and output buffer that synchronizes the data with the data strobe signal.

21. The data masking circuit according to claim 15 further comprising a data masking buffer that synchronizes the data masking signal with the data strobe signal.

22. The data masking circuit according to claim 14, wherein the column selecting portion comprises:

a first transistor that is gated by the first column select line signal, to produce the first masked data on the first data line; and a second transistor that is gated by the second column select line signal, to produce the second masked data on the second data line.

23. A data masking apparatus for an integrated circuit memory device, comprising:

first means for generating first and second column select line signals from an address and a write command that are synchronized with a clock signal;

second means for transmitting first and second data from data that is synchronized with a data strobe signal that is different from the clock signal, at least one of the first and second means also being responsive to a data masking signal that is synchronized with the data strobe signal; and third means for transmitting the first and second data to respective first and second data lines in response to the respective first and second column select line signals.

24. The data masking apparatus according to claim 23, wherein the first means generates the first and second column select line signals from the address and the write command that are synchronized with a clock signal and from the data masking signal that is synchronized with the data strobe signal.

25. The data masking apparatus according to claim 23, wherein the second means transmits the first and second data from the data and the data masking signal that are synchronized with a data strobe signal.

26. The data masking apparatus according to claim 23 further comprising means for synchronizing the address with the clock signal.

27. The data masking apparatus according to claim 23 further comprising means for synchronizing the write command with the clock signal.

28. The data masking apparatus according to claim 23 further comprising means for synchronizing the data with the data strobe signal.

29. A data masking apparatus according to claim 23 further comprising means for synchronizing the data masking signal with the data strobe signal.

30. A data masking method for an integrated circuit memory device, the method comprising the steps of:

synchronizing an address and a write command with a clock signal;

synchronizing data and a data masking signal with a data strobe signal that is different from the clock signal;

generating first and second column select line signals in response to the address and the write command that are synchronized;

generating first and second data that is synchronized with rising and falling edges of the data strobe signal, respectively, in response to the data that are synchronized; and transferring the first and second data to first and second data lines in response to the respective first and second column select line signals, to produce first and second masked data on the first and second data lines.

31. The method according to claim 30, wherein the step of generating first and second column select line signals in response to the address and the write command that are synchronized comprises the step of generating first and second column select line signals that are masked in response to the address and the write command that are synchronized with the clock signal and the first and second data masking signal that is synchronized with the data strobe signal.

32. The method according to claim 30, wherein the step of generating first and second data that is synchronized with rising and falling edges of the data strobe signal, respectively, in response to the data that are synchronized comprises the step of generating first and second data that is masked by the data masking signal and is synchronized with rising and falling edges of the data strobe signal, respectively, in response to the data that are synchronized.

33. The method according to claim 30, wherein the step of synchronizing the address and the write command with the clock signal comprises the steps of:

buffering the address in response to the clock signal; and buffering the write command in response to the clock signal.

34. The method according to claim 30, wherein the step of synchronizing data and the data masking signal with the data strobe signal comprises the steps of:

buffering data in response to the data strobe signal that is different from the clock signal; and buffering the data masking signal that masks the data in response to the data strobe signal.

* * * * *

UNITED STATES PATENT AND TRADEMARK OFFICE
CERTIFICATE OF CORRECTION

PATENT NO.    : 6,034,916
DATED         : March 7, 2000
INVENTOR(S)   : Jae-hyeong Lee Page 1 of 1

It is certified that error appears in the above-identified patent and that said Letters Patent is hereby corrected as shown below:

Title page,
Item [56], please add the following references:

EP 0 773 549 A2    05/14/97    EPO
0 605 887 A2       07/13/94    EPO
0 591 009 A2       04/06/94    EPO
Un Rapport de Recherche Preliminaire, No. 9814486000, September 10, 1999
Search Report, GB 9825292.7, March 16, 1999

Column 8,
Line 49, please delete "second" and substitute -- sixth -- therefor.
Line 57, please delete "first" and substitute -- fifth -- therefor.
Line 60, please delete "second" and substitute -- sixth -- therefor.

Column 10,
Line 59, please delete "A" and substitute -- The -- therefor.

Signed and Sealed this

Fifth Day of February, 2002

Attest:

JAMES E. ROGAN
Attesting Officer    Director of the United States Patent and Trademark Office